TRANSISTOR POWER AMPLIFIER WITH PROTECTIVE CIRCUITRY

Filed March 26, 1968 4 Sheets-Sheet 1

INVENTOR.
Martin G. Reiffin

Feb. 10, 1970 M. G. REIFFIN 3,495,181

TRANSISTOR POWER AMPLIFIER WITH PROTECTIVE CIRCUITRY

Filed March 26, 1968 4 Sheets-Sheet 2

INVENTOR.

Martin G. Reiffin

INVENTOR
MARTIN G. REIFFIN

United States Patent Office 3,495,181
Patented Feb. 10, 1970

3,495,181
TRANSISTOR POWER AMPLIFIER WITH PROTECTIVE CIRCUITRY

Martin G. Reiffin, 102 Gallows Hill Road, Peekskill, N.Y. 10566

Continuation-in-part of application Ser. No. 473,981, July 22, 1965. This application Mar. 26, 1968, Ser. No. 716,225
Int. Cl. H03f *3/18*
U.S. Cl. 330—13 24 Claims

ABSTRACT OF THE DISCLOSURE

A transistor power amplifier is provided with a protective circuit comprising a pair of complementary transistors which are normally cut off. A resistor in series with the output transistors and the load senses the instantaneous current of the active output transistor and applies to the base-emitter junction of a respective one of the protective transistors a signal tending to forward bias the junction in proportion to the instantaneous output transistor current. Opposing this forward-biasing signal is a signal proportional to the voltage swing of the output terminal and tending to reverse-bias the base-emitter junction of said protective transistor. If the net effect is to forward-bias said junction the protective transistor is activated to clip the drive signal at the collector of a common-emitter amplification stage. A network direct-current couples said collector to the bases of a complementary-symmetry push-pull drive stage in turn direct-current coupled to a single-ended push-pull output stage.

Cross-references

The present application is a continuation-in-part of my prior copending applications Ser. No. 473,981 filed July 22, 1965, entitled "Transistor Power Amplifiers With Protective Circuit Means," now abandoned, and Ser. No. 654,947 filed May 10, 1967, entitled "Direct-Current-Coupled Transistor Power Amplifiers," now Patent No. 3,376,388 issued Apr. 2, 1968, both prior applications being continuations-in-part of my prior now-abandoned application Ser. No. 388,399 filed Aug. 10, 1964, entitled "Transistor Power Amplifiers and Feedback Systems Embodying Same."

Field of the invention

This invention relates generally to transistor power amplifiers, for high-fidenity music reproduction and more particularly to an amplifier having a novel circuit to protect the output stage from excessive power dissipation or second breakdown due to steep or elliptical load-lines such as may be caused by a short across the output terminals or by phase shift at frequency extremes or with reactive loads, but which protective circuit will nevertheless introduce no audible distortion under conditions of extremely critical listening to high-fidelity music even at realistically loud sound levels provided that the amplifier is operating along safe load-lines.

In the present state of the art the major disadvantage of transistor power amplifiers, as compared with their tube-type competitors, is their vulnerability to destruction when subjected to shorts across their output terminals, or to large signals at frequency extremes, or to reactive loads. Either circumstance is likely to cause the operating point of one or both of the output transistors to enter the second breakdown region and be destroyed instantly.

The output transistors are usually the most expensive of the components. Furthermore, they cannot be replaced by the consumer and are usually of a special type so as to require return of the amplifier to the factory for replacement. Also, failure of the output transistors will, in many circuits, cause destruction of one or more of the previous transistor stages. Therefore this vulnerability of transistor amplifiers presents the most important problem which the art has been attempting to solve.

Description of the prior art

One attempted solution has been to employ fuses in the power supply line or output line. However, this expedient proved futile because even if the fuses were of the quick-acting instrument type the transistors usually failed before the fuss.

In some circuit designs the fuse ratings were selected so as to be substantially less than the transistor dissipation ratings so that the fuse would blow before the transistors failed. However, this resulted in a maximum power output far below the inherent capability of the output transistors. Hence the latter were required to be of extremely expensive types for amplifiers having reasonably large power ratings. Furthermore, even with this type of design there was no assured protection because the transistors would sometimes be destroyed before the fuse could blow.

A widely employed solution was to employ an electronic protective circuit to cut-off or clip the drive signal or the power supply line when the current through the load reached a predetermined magnitude. As explained further in the detailed description below, this expedient also severely limited the maximum power output capability of the amplifier. That is, the maximum current level permissible under short-circuit conditions should be substantially less than the level permissible when driving a speaker or other normal load. Hence the predetermined load current magnitude at which the protective circuit would cut-off or clip the drive signal had to be set at a level which prevented the attainment of full power output into a proper load.

Another serious disadvantage of those prior electronic protective circuits which clipped the drive signal resided in the increased distortion which they created at high signal levels. That is, instead of clipping cleanly at the overload point of one of the stages as in a conventional well-designed amplifier, the protective circuit first came into operation to produce a distorted signal with excessively audible harmonics.

Other prior electronic protective circuits were further disadvantageous in that they did not function instantaneously. For example, the predetermined magnitude of load current would cause a capacitor to charge and the protective circuit did not come into operation until the voltage of the capacitor attained a certain level. This usually required several cycles of signal swing and was not always fast enough to protect the transistors.

Other prior protective arrangements were inadequate because they were operative only in one direction of amplifier signal swing polarity and were ineffective for the other half-cycle of the signal swing.

Another problem arising in at least one prior protective circuit was the need for several active stages within the circuit feedback loop and which resulted in excessive phase shift and positive feedback. The latter caused oscillation problems in turn requiring the use of a filter capacitor which prevented the circuit from functioning instantaneously.

Still other prior electronic protective circuits were further disadvantageous in that they stopped the operation of the amplifier completely until the operator made some manual manipulation such as shutting the amplifier off and then turning it on again. Hence if the short or other inducing condition were removed immediately the amplifier would nevertheless remain inoperative. Other prior circuits involved a time period for recovery during which the amplifier was inoperative or distorted the signal.

Summary of the invention

It is therefore a primary object of the present invention to provide a novel protective circuit which permits the amplifier to put out into a proper load the maximum power output of which the circuit is capable, but which will instantly limit the power to a safe level when the operating point or instantaneous power dissipation of the output transistors is about to enter a forbidden region due to a short across the output or to a large phase shift.

This is achieved by an arrangement which responds not only to the current through the load, but also to the voltage across the load. That is, when the load is of a proper magnitude, such as from four to sixteen ohms for audio applications, the load-line of the output stage has a small inclination so that at high current levels the voltage across the load is large whereas the voltage across the conducting output transistor is small. Hence the latter can pass a relatively large collector-to-emitter current without excessive dissipation.

However, when the load-line is vertical due to a short across the output, or steep due to a low impedance load, or elliptical due to phase shift, the instantaneous voltage across the load may be low whereas that across the conducting output transistor may be high. In this event the conducting transistor can pass only a small collector-to-emitter current before its power dissipation rating is reached or without the operating point entering a forbidden region of possible second breakdown.

Therefore the protective circuit of the present invention senses the voltage across the load and permits the amplifier to drive a large peak current through the load when the peak voltage across the conducting transistor is small, as under normal conditions, and to drive only a small current when said peak voltage is large, as for example, under shorted output conditions.

A further object is to provide a novel protective circuit that continuously senses the instantaneous voltage and current across the load and which reacts instantly to prevent the instantaneous power dissipation of the output stage from exceeding a predetermined limit.

Still another object is to provide a novel protective circuit which is operative during both half-cycles of amplifier signal swing. This is achieved in the disclosed embodiments by a pair of complementary protective transistors with each being operative in a respective direction of signal swing.

A further object is to provide a novel protective circuit having in the preferred embodiment only a single active stage, and less than unity voltage gain in the amplifier forward transmission path of the feedback loop formed by the protective circuit, so as to eliminate any oscillatory tendency due to excessive phase shift and positive feedback.

Another object is to provide a novel protective circuit which permits the amplifier to recover and resume normal operation instantly as soon as the short or other inciting condition disappears and without requiring any manual operation and without any time delay during which the amplifier is inoperative or distorting the signal.

Other objects and advantages are either inherent in the structure disclosed herein or will be apparent to those skilled in the art as the detailed description proceeds in connection with the accompanying drawings.

Detailed description

Figure 1:
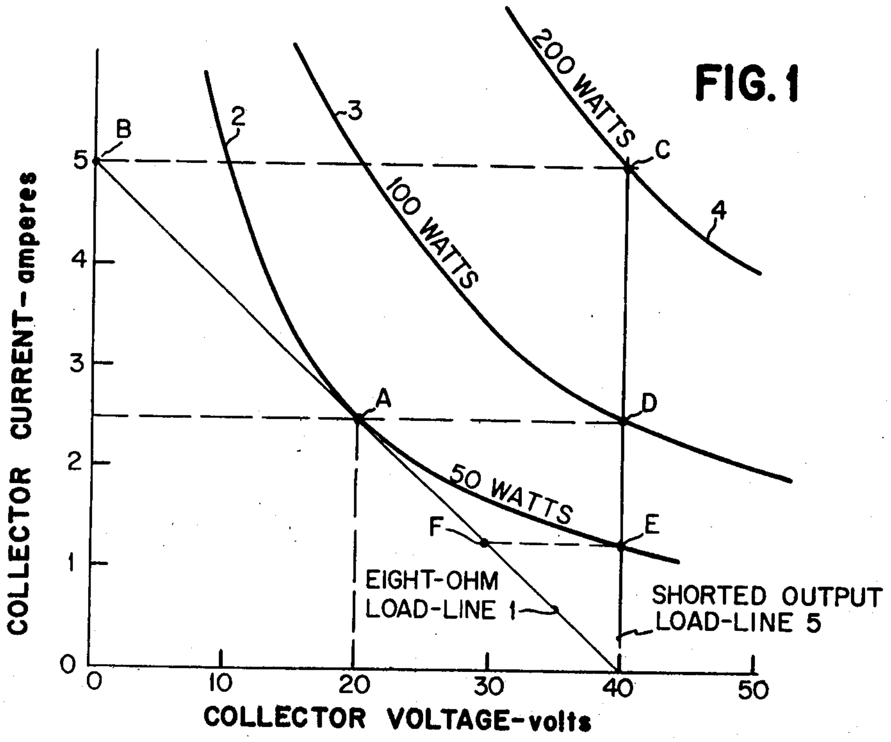
FIG. 1 is a plot of an eight-ohm load-line and several power dissipation curves.

Referring now to the drawings in more detail, and in particular to FIG. 1, the general mode of operation of the subject invention will first be briefly described. In order to better illustrate the problem and its solution, FIG. 1 shows a typical example of an eight-ohm load-line at 1 and extending from a collector voltage of 40 volts to a collector current of 5 amperes. It is assumed that the operation of each output transistor of a push-pull pair is in the Class B mode without any quiescent bias current, and that the saturation resistance line is coincident with the collector current ordinate.

Hence the operating point of each output transistor travels during the active half-cycle along load-line 1 from the initial quiescent point at the 40 volt intersection of load-line 1 with the collector voltage abscissa upwardly toward the peak point B at the 5 ampere intersection with the collector current ordinate, and then back again. The maximum instantaneous transistor power dissipation occurs at A where load-line 1 is tangent to the 50 watt dissipation curve 2, and clipping theoretically occurs at the peak point B. The power output for a sine-wave signal, which is equal to the area of the triangle bounded by load-line 1, the vertical current ordinate, and the horizontal voltage abscissa, is 100 watts in this instance.

However, if the output terminals of the amplifier are shorted, the load-line then becomes substantially vertical as indicated at 5. Let it be assumed that the amplifier embodies an electronic protective circuit of the prior art type wherein the circuit is activated in response to the current flowing through the load. If this protective circuit is not to reduce the maximum power output capability of the amplifier, it must be set so as to limit the signal at a load current of not less than 5 amperes. With this setting, the protective circuit will permit the operating point to travel up shorted output load-line 5 to C where the collector current is 5 amperes and the instantaneous transistor power dissipation is 200 watts.

If the transistor dissipation is rated at 50 watts as required by the normal eight-ohm load, then the transistor is likely to be destroyed by second breakdown if its operating point reaches the 200 watt level at C. On the other hand, if said prior art protective circuit is set to operate at a load current level which will prevent the instantaneous transistor dissipation from exceeding the normal-operation maximum of 50 watts, then the circuit must allow the operating point to travel up shorted output load-line 5 no further than the intersection E with 50 watt dissipation curve 2. However, this is at a collector current of only 1.25 amperes, so that with a normal eight-ohm load the protective circuit will limit the swing to point F. The resulting maximum power output will be merely 6.25 watts.

Obviously either alternative is unacceptable and the conventional solution of the prior art has been to compromise the maximum amplifier power, the dissipation rating of the output transistors, and the margin of safety provided by the protective circuit. For example, the transistor may be of a more expensive type having a rating permitting its operating point to safely reach the 100-watt level. The protective circuit may then be set to limit the amplifier operation at a maximum load current of 2.5 amperes. In this event, when the output is shorted the operating point will travel up shorted output load-line 5 no farther than the intersection D with 100 watt dissipation curve 3.

The transistor is thus protected against destruction, but the maximum power output is severely limited because with a normal eight-ohm load the protective circuit will not permit the operating point to swing farther than point A. The maximum power output is thus reduced from 100 watts to 25 watts, and the compromise is compounded by the requirement for output transistors having twice the dissipation rating.

The present invention obviates the above-noted difficulties of the prior protective circuits. Under normal load conditions the operating point may swing all the way to the amplifier clipping point as at B in FIG. 1, so as to provide undiminished power capability; whereas under shorted output conditions the present protective circuit may be set to limit amplifier operation at the dissipation rating of the transistors such as at point E, so as to eliminate any requirement for a more expensive transistor type. Thus design compromises including reduced power and increased cost are avoided.

This is achieved with the present invention by a novel protective circuit which senses not merely the load current but also the load voltage so as to respond in effect to the operating point locus which in turn is a measure of the instantaneous power dissipation in the output stage. That is, when the instantaneous load voltage is large and therefore the collector-to-emitter voltage small, as at the peak of the swing with a normal load, the circuit will permit the amplifier to drive a large current through the load (at least 5 amperes in the example shown in FIG. 1). However, when the peak load voltage is small, as with a shorted output, the circuit will automatically limit the amplifier operation so as to restrict the load current and therefore the output transistor dissipation to a relatively low level (as low as 1.25 amperes and 50 watts in the example of FIG. 1). In other words, the load current level at which the protective circuit will become operative to limit the amplifier varies continuously and automatically with the instantaneous load voltage. Protection is thus provided with maximum power output and economy.

Figure 2:
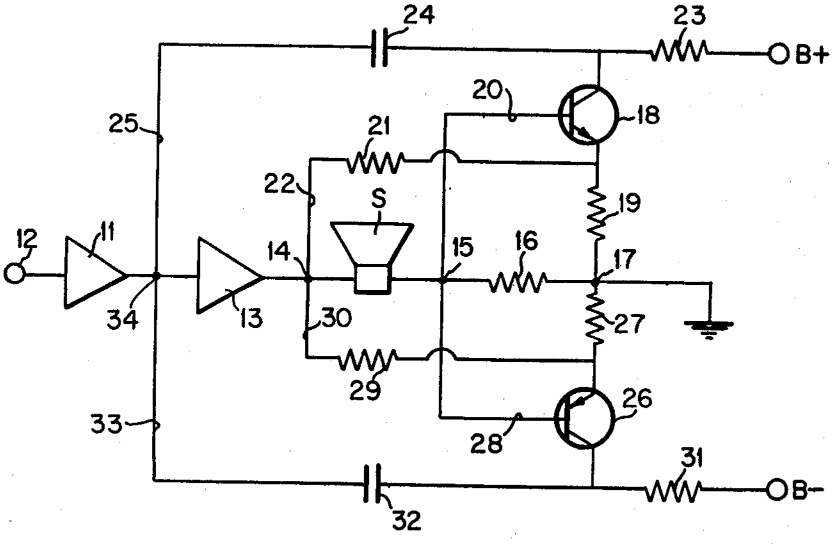
FIG. 2 is a circuit diagram showing a protective circuit embodying the invention and applied to an amplifier shown only schematically.

The manner in which this is achieved is shown schematically in FIG. 2. The reference numeral 11 indicates generally one or more initial stages of the amplifier and having an input 12. The final stage or stages is indicated at 13 and has an output terminal 14. The other output terminal 15 is connected to one end of a resistor 16 having its other end connected to ground at 17. A speaker S or other load is connected between terminals 14, 15.

A first transistor 18 of NPN type has its emitter connected to ground through resistor 19 and its base is connected through lead 20 to output terminal 15. The emitter is also connected to output terminal 14 through resistor 21 and lead 22. The collector is provided with a resistor 23 extending to the B+ supply terminal. A capacitor 24 and lead 25 extend from the collector to an inhibiting signal injection node 34.

A second transistor 26 of PNP type is similarly provided with an emitter connected to ground through resistor 27, and a base connected through lead 28 to output terminal 15. The latter emitter is also connected to output terminal 14 through resistor 29 and lead 30. The collector of transistor 26 is provided with a resistor 31 extending to the B− supply terminal and is connected to said node 34 by capacitor 32 in series with lead 33.

Since resistor 16 is in series with load S, the voltage at output terminal 15 will be directly proportional to the load current. Also, the value of resistor 16 is preferably only a fraction of an ohm. Therefore the voltage at output terminal 14 will be practically the entire voltage across the load S. The respective instantaneous voltages at terminals 14, 15 therefore contain the information as to the instantaneous power dissipation occurring in the amplifier output stage and are applied to transistors 18, 26 to provide the following mode of operation.

Transistors 18, 26 are normally cut off when the load is of a proper value. As the operating point travels up load-line 1 in FIG. 1, the potential of output terminal 15 will increase in either the positive or negative direction, depending upon which output transistor of the push-pull output stage is active, so as to increase the voltage at the base of either transistor 18 or 26, thereby tending to turn on the latter and pull it out of the cut-off state. However this tendency is counteracted by the large voltage swing at output terminal 14 which applies a sufficiently large voltage to the emitter of said transistor 18 or 26 to maintain it cut off. Therefore the circuit remains inactive with a normal load and has no deleterious effect upon the amplifier output, either with respect to maximum power capability or distortion at high signal levels.

Now let it be assumed that output terminals 14, 15 are shorted or connected to an excessively low load impedance. In this event the potential of output terminal 14 will have a negligible swing and will not apply a cut-off voltage to the emitters of transistors 18, 26. The potential swing at the other output terminal 15 will thus transmit a signal to the base of one of said transistors 18, 26 to cause it to turn on and draw current from a respective one of the supply terminals B+ or B− through one of the collector resistors 23 or 31. The respective collector will thereby have a voltage swing which will be transmitted by capacitor 24 or 32 to said injection node 34.

The phase of the signal thereby transmitted to node 34 is opposite to that of the forward signal being transmitted from initial stages 11 to final stages 13, thereby tending to oppose said forward signal so as to limit its amplitude. As a result the last of stages 13, the output stage, will receive a reduced drive signal to maintain the operating point within a specified region and hence the power dissipation of the output transistors within the rated value. By selecting the values of resistors 19, 21 and 27, 29 in the proper ratio and in relation to resistor 16 the maximum power dissipation under the shorted output conditions may be limited to substantially any practical value which will avoid destruction of the transistors without reducing the maximum power output under normal load conditions.

It will be seen that transistor 18 is normally cut-off and can become active during the positive upward swing of output terminal 14, whereas transistor 26 can become active during the negative downward swing of terminal 14. If desired, by interchanging the base and emitter connections the circuit may be rearranged to provide that transistors 18, 26 are normally in the active or saturation regions and are driven in either direction in response to the simultaneous occurrence of the requisite load voltage and load current conditions to indicate a predetermined power dissipation level in the output stage. In this event it is merely necessary to assure that the inhibiting signal transmitted from the collectors to node 34 is opposite in phase to the forward signal at the latter.

It will also be understood that the inhibiting signals from the collectors need not be returned to the same node. For example, capacitor 24 may be connected through lead 25 to the base of a transistor within the forward path of the amplifier comprising stages 11 and 13 whereas capacitor 32 may be connected through lead 33 to the collector of the same or a different transistor within the amplifier.

Furthermore the coupling between the collectors of transistors 18, 26 and said nodes may be direct or diode-coupled as in the modification of FIG. 3 to be described below, rather than capacitor-coupled as shown at 24, 32 in FIG. 2. Similarly, the interconnection between the amplifier output stage and speaker S or other load may be either capacitor-coupled or direct-coupled as shown. Other modifications will be readily apparent to those skilled in the art.

Figure 3:
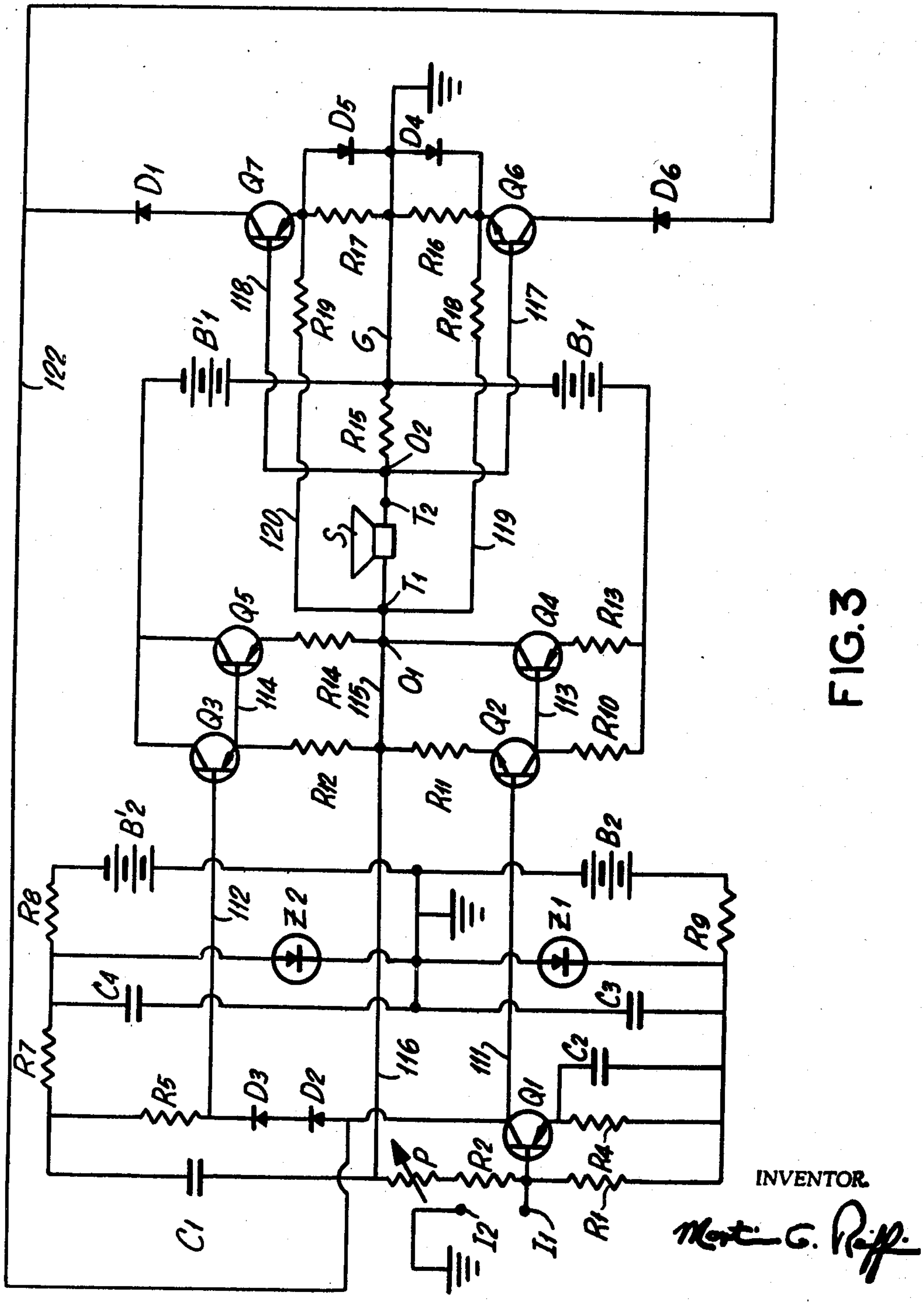
FIG. 3 shows a modified form of protective circuit embodied in a direct-coupled quasi-complementary amplifier.

Referring now to FIG. 3, there is shown in detail a specific amplifier circuit embodying a modified form of protection circuit. The amplifier comprises a pre-drive stage including transistor Q1 operating in the Class A common-emitter mode. The base of transistor Q1 is connected to the input terminal I1, the other input terminal I2, being grounded as shown. Feedback bias for the base of Q1 is provided by potentiometer P, resistor R2 and resistor R1. The emitter of transistor Q1 is provided with a resistor R4 bypassed by capacitor C2.

A pair of temperature-compensating bias diodes D2, D3 are connected in series to the collector of transistor Q1 and two load resistors R5, R7 are connected in series with these diodes. A bootstrapping capacitor C1 extends from the upper end of potentiometer P to the junction of resistor R5 and one end of resistor R7. The opposite end of resistor R7 is connected to the negative end of a Zener diode Z2 having its positive end connected to ground. Similarly, the lower ends of resistors R1 and R4 are connected to the positive end of another Zener diode Z1 having its negative end grounded as shown.

The battery symbols designated at B2 and B'2 indicate the respective half-sections of a split auxiliary power supply having its center-tap grounded. The negative terminal of this auxiliary power supply is connected through resistor R8 to the negative end of Zener diode Z2, and the positive terminal of the power supply is connected through resistor R9 to the positive end of the other Zener diode Z1. In order to provide additional filtering and a lower hum level, capacitors C3 and C4 are connected in parallel with Zener diodes Z1 and Z2 respectively.

The drive stage comprises an NPN transistor Q2 and a PNP transistor Q3. The base of transistor Q2 is direct-coupled to the collector of pre-drive transistor Q1 by lead 111 and the base of drive transistor Q3 is direct-coupled by lead 112 to the junction of diode D3 and load resistor R5. The emitters of drive transistors Q2, Q3 are connected by respective bias resistors R11, R12 to the output bus 115 which is in turn connected to the output terminal O1.

The battery symbols designated as B1 and B'1 indicate the respective half-sections of the main power supply which is split and has its center-tap connected to the ground bus G. The collector of drive transistor Q3 is connected to the negative terminal of the power supply section B'1 and the collector of drive transistor Q2 is connected through bias resistor R10 to the positive terminal of the other power supply section B1.

The output stage comprises two power transistors Q4, Q5 arranged in series with the collector of Q4 connected to the output terminal O1 and the emitter of Q5 connected through bias resistor R14 to the same output terminal O1. The collector of output transistor Q5 is connected to the negative terminal of the power supply and the emitter of output transistor Q4 is connected through bias resistor R13 to the positive terminal thereof. The base of output transistor Q4 is direct-coupled by lead 113 to the collector of drive transistor Q2 and the base of the other output transistor Q5 is similarly direct-coupled by lead 114 to the emitter of the other drive transistor Q3.

Output terminal O2 is connected to one end of a resistor R15 having its opposite end connected to the ground bus G. The resistance of resistor R15 is preferably only a fraction of an ohm so as to avoid the dissipation of any substantial amount of power therein. The voltage signal at output terminal O2 will thus provide information as to the instantaneous current flowing through the loudspeaker S or other load.

The protection circuit of FIG. 3 further comprises an NPN transistor Q6 and a PNP transistor Q7. The bases of these transistors are connected to output terminal O2 by leads 117, 118 respectively. The emitters of transistors Q6, Q7 are connected by the respective resistors R16, R17 to ground bus G. The respective emitters are also connected through resistors R18, R19 to speaker terminal T1 which is direct-coupled to output terminal O1. Diodes D4, D5 are connected from the respective emitters to ground. The collectors of transistors Q6, Q7 are connected by diodes D6 and D1 and lead 122 to the collector of transistor Q1 which corresponds to the inhibiting signal injection node 34 in FIG. 2.

The initial function of the protection circuit is to measure the instantaneous voltage and current in the output stage so as to determine the operating point and hence the instantaneous power dissipation of the output transistors. In the event that this instantaneous power dissipation tends to exceed a predetermined limit, as indicated by the entry of the operating point into a forbidden region, the protection circuit then clips the peaks of the signal in the pre-drive stage Q1 so as to prevent the power dissipation in the output transistors from exceeding said limit. That is, the protection circuit prevents the simultaneous occurrence of high instantaneous voltage and high instantaneous current in the output stage transistors so as to avoid second breakdown or thermal destruction of the latter by a short circuit across the output terminals or by a low-magnitude or reactive load-line.

The mode of operation of the protection circuit of FIG. 3 is as follows. Both transistors Q6 and Q7 are normally cut off since their base-emitter junctions are normally reverse-biased by the base leads 117, 118 and emitter resistors R16, R17. Let it now be assumed that the potential of output terminal O1 is swinging upwardly in the negative direction in response to a signal input to the amplifier. Current will then flow through the loudspeaker S and resistor R15 so that the potential of output terminal O2 will also swing upwardly in the negative direction. If loudspeaker S presents a normal load impedance to the amplifier, the potential of the emitter of transistor Q7 will swing upwardly in the negative direction a sufficient amount to maintain transistor Q7 reverse-biased and cut off.

Now let it be assumed that the impedance of loudspeaker S or other load is excessively low, or that the output terminals are short circuited. The upward negative swing of the potential of output terminal O1 will be negligible or substantially reduced whereas the load current flowing through resistor R15 will cause the potential of output terminal O2 to swing negatively with a magnitude proportional to the load current. If the load current as indicated by the voltage signal at O2 increases excessively as compared with the voltage swing as indicated by the signal at O1, then the base of transistor Q7 will become sufficiently more negative than its emitter so as to forward bias the base-emitter junction of transistor Q7. In this event transistor Q7 enters the active region and draws collector current through lead 122 and diode D1 so as to prevent the collector of transistor Q1 from swinging more negatively in the upward direction. The negative peaks in the signal of the pre-drive transistor Q1 are thus clipped so as to limit the signal drive to the output stage.

The same mode of operation occurs when output terminal O1 swings downwardly in the positive direction. If the impedance of the loudspeaker S or other load across the output terminals is normal then the potential of output terminal O1 will swing positively with a sufficient amplitude to maintain transistor Q6 cut off notwithstanding that the load current flowing through resistor R15 is causing the potential of output terminal O2 and hence the base of transistor Q6 to swing downwardly in the positive direction. However, if the load impedance is too low, the potential of output terminal O1 will not swing sufficiently in the positive direction to counteract the increasing positive potential of the base of transistor Q6 due to the load current through resistor R15. In this event, transistor Q6 will enter the active region and will draw collector current through lead 122 and diode D6 so as to urge the potential at the collector of transistor Q1 upwardly in the negative direction toward ground potential. This will cause pre-drive transistor Q1 to clip during the peaks of the positive swing so as to limit the drive signal to the output stage.

Diode D4 functions to clamp the emitter of transistor Q6 to ground so as to maintain this transistor cut off during the upward negative swing of output terminal O1. Similarly, diode D5 serves to clamp the emitter of transistor Q7 to ground during the downward positive swing of output terminal O1 so as to maintain transistor Q7 cut off during the positive half-cycle. Diodes D1 and D5 prevent the respective collector-base junctions of transistors Q7 and Q6 from becoming forward biased as the collector of transistor Q1 swings in each direction from ground potential.

It will be seen that the protective circuit is actuated instantaneously as soon as the need arises, and that it is deactuated instantaneously and automatically, without requiring any intervention on the part of the operator, as soon as the instantaneous power dissipation in the output stage is reduced to the predetermined limit determined by the relative magnitudes of resistors R15 to R19 inclusive and the cut-in voltages of transistors Q6, Q7.

Although the above-described mode of operation assumed that the excessive instantaneous power dissipation came about as a result of an excessively low impedance across the output terminals O1, O2, it will be understood that this condition may also arise due to large phase shift arising from the power supply or from reactive loads or upon the application of large signals at frequency extremes.

A preferred set of values for the components of the protective circuit of FIG. 3 is shown by the following parts list:

| | |
|---|---|
| Q6 | 2N697. |
| Q7 | 2N1131. |
| R15 | 0.56 ohm, 2 watts. |
| R16, R17 | 47 ohm, ½ watt. |
| R18 | 1K, 1 watt. |
| R19 | 1.5K, 1 watt. |

The values of resistors R18 and R19 were obtained empirically as the respective maximum values which just prevented clipping at each opposite peak of the signal at maximum power output into an eight-ohm non-inductive resistive load at a frequency of 1 kc.

Figure 4:
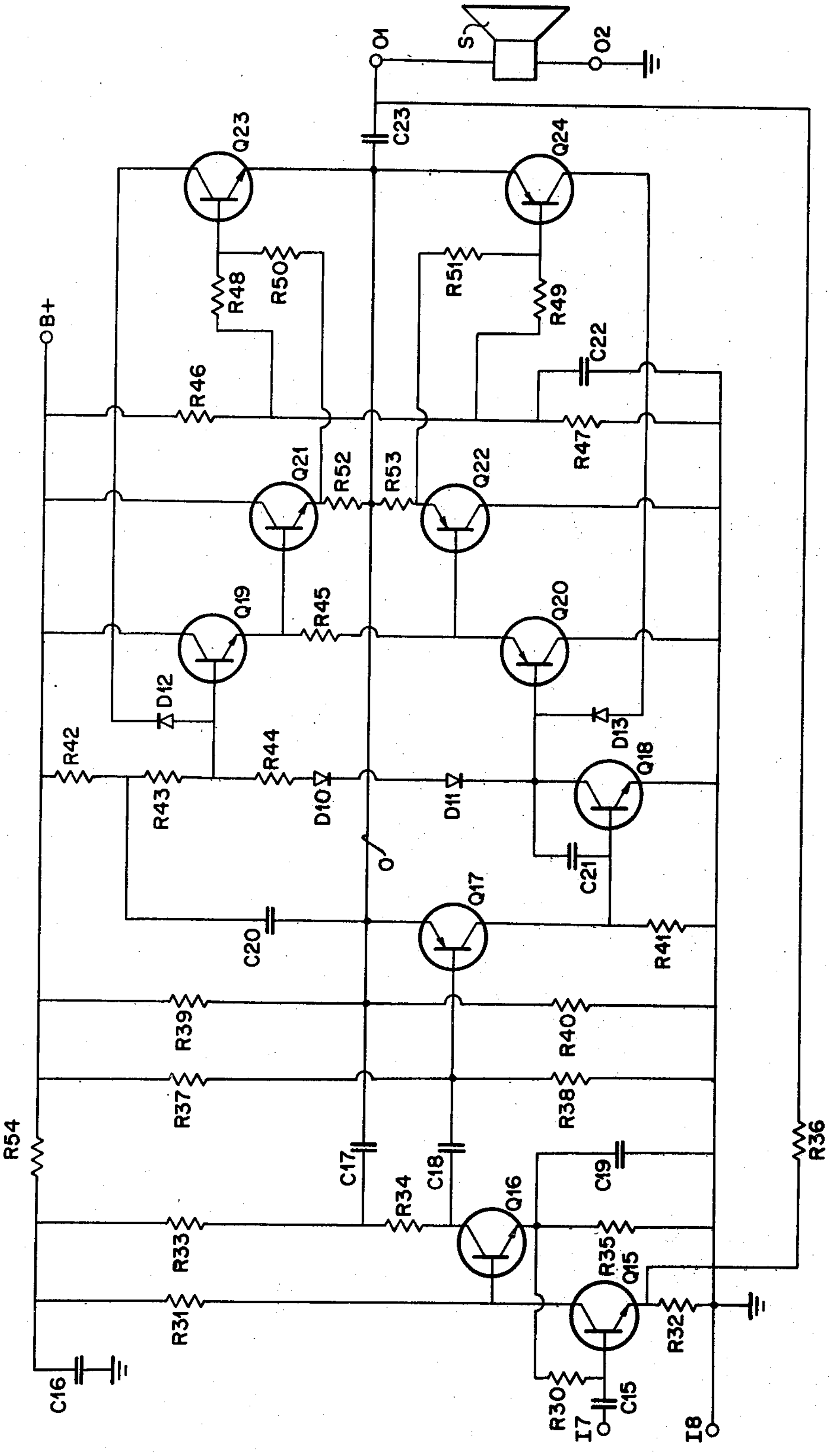
FIG. 4 is a modified form of the invention wherein the output stage is capacitor-coupled to the load and including a complementary-symmetry output stage and additional pre-drive stages.

Referring now to FIG. 4, there is shown the modified form of the invention wherein the output stage is capacitor-coupled to the load and including a complementary-symmetry output stage and additional pre-drive stages. More specifically, the hot input terminal I7 is coupled by capacitor C15 to the base of a transistor Q15 whereas the other input terminal I8 is grounded as shown. Transistor Q15 is a Class A amplifier stage operating in the common-emitter mode. An unbypassed resistor R32 extends from the emitter of Q15 to ground and constitutes a part of the overall feedback network to be described. The collector of transistor Q15 is provided with a load resistor R31. The collector of transistor Q15 is direct coupled to the base of a transistor Q16 also operating in the Class A common-emitter mode. A resistor R35 extends from the emitter of transistor Q16 to ground and is bypassed by a capacitor Q19. A base bias resistor R30 extends from the emitter of transistor Q16 to the base of transistor Q15 to provide bias current for the latter. The collector of transistor Q16 is provided with a pair of load resistors R33, R34 at the junction of which is connected a bootstrapping capacitor C17 extending from the output bus O.

The collector of transistor Q16 is coupled by capacitor C18 to the base of a transistor Q17. The latter is of type PNP whereas transistors Q15 and Q16 are of type NPN. A pair of resistors R37, R38 provide a bias network for the base of transistor Q17 and extend therefrom to the B+ supply and ground terminals respectively. The emitter of transistor Q17 is connected to output bus O and is biased by a pair of resistors R39, R40 also extending from the B+ supply and ground terminals respectively to provide emitter current for transistor Q17. The collector of transistor Q17 is connected to ground by a load resistor R41.

The collector of transistor Q17 is direct-current coupled to the base of a transistor Q18 operating in the Class A common-emitter mode and having its emitter connected directly to ground. Extending from the B+ supply terminal to the collector of transistor Q18 is a series arrangement of a pair of load resistors R42, R43 and a pair of bias diodes D10, D11 together with a bias resistor R44. A bootstrapping capacitor C20 extends from output bus O to junction of collector load resistors R42, R43. Connected between the collector and base of transistor Q18 is a phase-shift capacitor C21 to increase the stability margin of the amplifier at high frequencies. It will be noted that transistor Q18 is of type NPN.

The next stage is a push-pull complementary-symmetry Class AB drive stage comprising an NPN transistor Q19 and a PNP transistor Q20. The base of transistor Q19 is direct-current coupled to the junction of load resistor R43 and bias resistor R44, and the base of transistor Q20 is direct-current coupled to the collector of transistor Q18. The collector of transistor Q19 is connected to the B+ supply terminal and the collector of transistor Q20 is connected to ground. A bias resistor R45 extends between the respective emitters of transistors Q19, Q20.

The output stage comprising output transistors Q21, Q22 is also of the push-pull complementary-symmetry type but operates in the Class B mode without any quiescent current. Transistor Q21 is of NPN type and transistor Q22 is of PNP type. The base of transistor Q21 is direct-current coupled to the emitter of drive transistor Q19 and the base of the other output transistor Q22 is similarly direct-current coupled to the emitter of the other drive transistor Q20. The collector of output transistor Q21 is connected to the B+ supply terminal and the collector of output transistor Q22 is connected to ground. A resistor R52 extends from the emitter of output transistor Q21 to output bus O and a resistor R53 similarly extends from the emitter of output transistor Q22 to said output bus O. The latter is in turn coupled by output coupling capacitor C23 to the hot output terminal O1 to which may be connected one terminal of a loudspeaker S or other load having its other terminal connected to the grounded terminal O2 as shown.

The ripple in the B+ supply terminal is filtered by a resistor R54 and decoupling capacitor C16 so as to provide a relatively ripple-free supply for the first two stages comprising transistors Q15, Q16. A feedback resistor R36 has one end direct-coupled to the output terminal O1 and its other end direct-coupled to the emitter of the first-stage transistor Q15 so as to provide overall feedback around the amplifier.

There is also an inner feedback network in the form of output bus O extending to the emitter of transistor Q17 to provide unity-gain feedback thereto in the manner described below in more detail with respect to the embodiment of FIG. 5.

The protective circuit comprises a complementary pair of transistors Q23 and Q24, the former being of NPN type and the latter of PNP type. A resistor R50 extends from the emitter of output transistor Q21 to the base of protective transistor Q23, and a resistor R51 similarly extends from the emitter of output transistor Q22 to the base of protective transistor Q24, the emitters of transistors Q23, Q24 are connected to output bus O. The collector of protective transistor Q23 is connected by a diode D12 to the base of drive transistor Q19, and the collector of protective transistor Q24 is similarly connected by a diode D13 to the base of drive transistor Q20.

In order to provide a supply node at a potential approximately midway between that of B+ and ground, a pair of substantially equal resistors R46, R47 are connected in series therebetween and a decoupling capacitor C22 extends from the junction of these two resistors to ground. The base of protective transistor Q23 is connected to this junction or supply node by resistor R48 and the base of protective transistor Q24 is similarly connected thereto by resistor R49.

It will thus be seen that as output bus O and output terminal O1 swing upwardly in the positive direction toward the B+ supply terminal the left-hand end of resistor R48 remains at a fixed potential and the right-hand end of this resistor R48 connected to the base of transistor Q23 tends to bias the latter toward the direction of cut-off. Similarly, when output bus O and output terminal O1 swing downwardly in the negative direction towards ground potential, resistor R49 tends to bias protective transistor Q24 in the direction of cut-off. Opposing these cut-off biases, the current through emitter resistor R52 causes a voltage drop across the latter which is transmitted through resistor R50 tending to turn protective transistor Q23 "on" during the upward swing of output bus O, and similarly the voltage drop across emitter resistor R53 is transmitted through resistor R51 tending to turn protective transistor Q24 "on" during the downward swing of output bus O.

During operation with normal load-line, protective transistors Q23, Q24 are maintained cut off. However, should the load-line be too steep due to a low-impedance load, or be excessively elliptical due to a highly reactive load or to operation at high frequencies, then the cut-off bias effect provided by resistors R48, R49 will be insufficent to maintain protective transistors Q23, Q24 cut off so that protective transistor Q23 will be activated during the half-cycle when output transistor Q21 is active, and protective transistor Q24 will be turned "on" during the other half-cycle when output transistor Q22 is active. Turning protective transistor Q23 "on" will cause current to be drawn by the collector thereof through diode D12 and thereby clip the upward signal swing at the base of drive transistor Q19. In a similar manner the turning "on" of protective transistor Q24 will cause current to flow to the collector thereof through diode D13 and thereby clip the downward signal swing at the base of drive transistor Q20. Clipping of the drive signal in this manner prevents the output stage transistors Q21, Q22 from being driven into a region of high instantaneous power dissipation where second breakdown is likely to occur.

Figure 5:
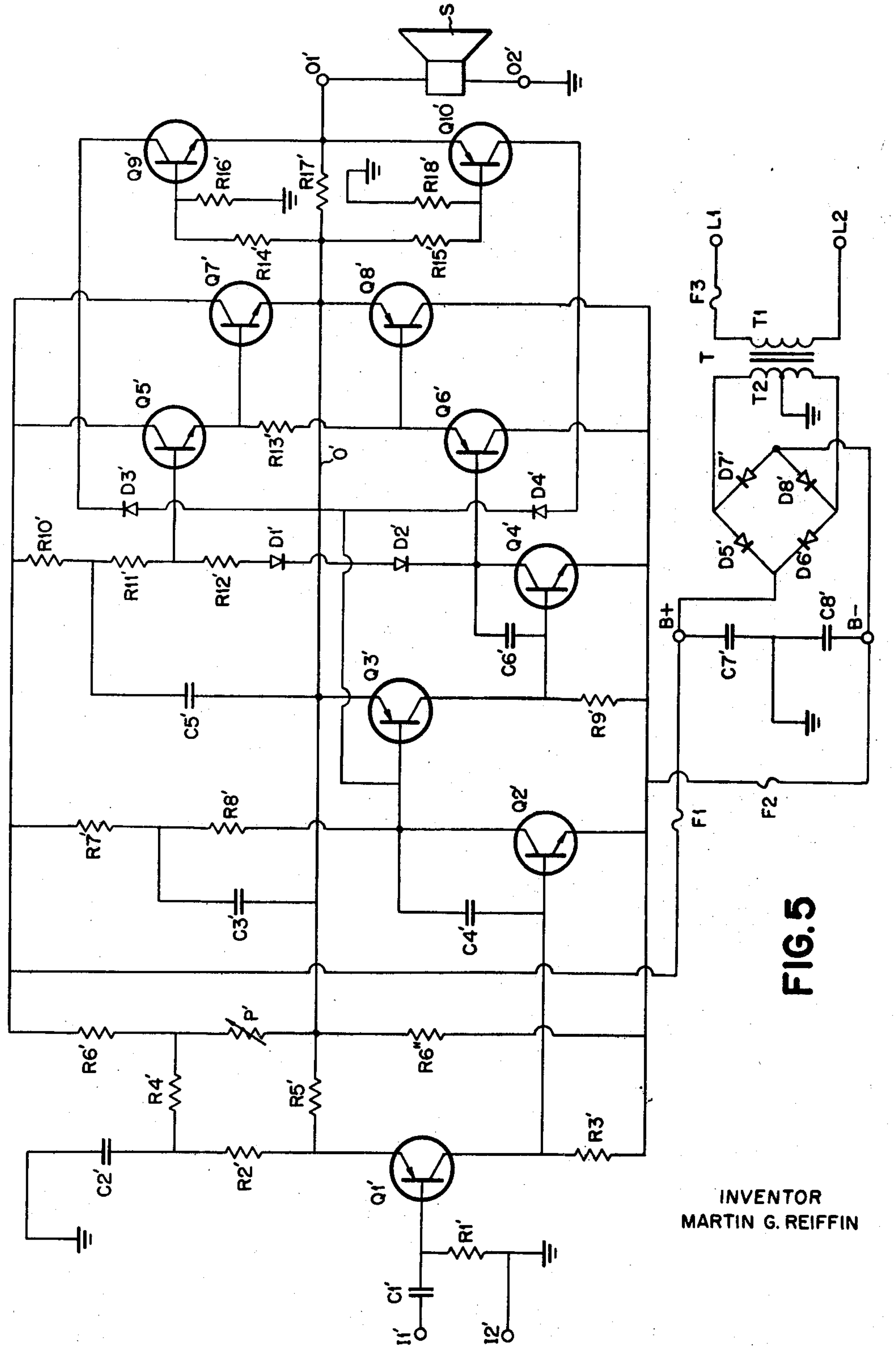
FIG. 5 is another modified form of the invention somewhat similar to FIG. 4 but having an output stage direct-coupled to the load as in FIG. 3.

Referring now to FIG. 5 there is disclosed another embodiment of the invention utilizing the same principles described above with respect to FIGS. 1 to 4. Input terminal I1′ is coupled by capacitor C1′ to the base of PNP transistor Q1′ operating Class A in the common-emitter mode. The other input terminal I2′ is grounded. In this embodiment the ground, instead of a Zener diode, serves as a source of reference potential in that bias resistor R1′ extends from ground to the base of transistor Q1′ to maintain the base at a fixed quiescent reference potential substantially independent of power supply regulation and ripple, ambient and operating temperature variations, and other variables.

A resistor R2′ and capacitor C2′ are connected in series between the emitter of transistor Q1′ and ground. Also connected to the emitter of transistor Q1′ is one end of a resistor R5′ having its other end connected to output bus O′ of the amplifier. A fixed resistor R6′ and a variable resistor in the form of a potentiometer P′ are connected in series between the B+ power supply terminal and output bus O′. A resistor R6″ extends from output bus O′ to the negative terminal B− of the power supply. A resistor R4′ extends between the junction of resistor R6′ and potentiometer O′ and the junction of capacitor C2′ and resistor R2′.

The function of resistors R4′, R6′ and potentiometer P′ is to bias the emitter of transistor Q1′ at a quiescent potential which is positive with respect to ground. This is necessary because of the voltage drops across the base-emitter junction of transistor Q1′ and the bias resistor R1′.

The second stage comprises an NPN transistor Q2′ operating Class A in the common-emitter mode and having its base direct-coupled to the collector of transistor Q1′, its emitter A.C.-coupled to ground through the negative supply terminal B−, and its collector connected to the lower end of a first load resistor R8′ having its upper end connected to a second load resistor R7′ in turn connected to the positive supply terminal B+. A capacitor C4′ may be provided between the collector and base of transistor Q2′ to provide a rolloff and phase shift at high frequencies so as to increase the stability margin of the amplifier. The usual bootstrapping capacitor C3′ extends from output bus O′ to the junction of load resistors R7′, R8′.

The third stage comprises a PNP transistor Q3′ having its base direct-coupled to the collector of transistor Q2′, its emitter conductively connected to output bus O′ and its collector connected through load resistor R9′ to the negative supply terminal B−. The connection of the emitter to output bus O′ provides so-called "unity-gain feedback" for a purpose to be described.

The fourth stage comprises an NPN transistor Q4′ operating Class A in the common-emitter mode and having its base direct-coupled to the collector of transistor Q3′, its emitter connected to the negative supply terminal B−, and its collector connected to the lower end of the usual temperature-compensating bias diodes D1′, D2′. Connected in series with the latter is a bias resistor R12′ and a pair of collector load resistors R10′, R11′. The upper end of resistor R10′ is connected to the positive supply terminal B+. Here again a phase shift capacitor C6′ may be provided between the collector and base of transistor Q4′ and the usual bootstrapping capacitor C5′ extends between output bus O′ and the junction of collector load resistors R10′, R11′.

The complementary push-pull drive stage comprises NPN transistor Q5′ and PNP transistor Q6′ having their emitters connected in series by a bias resistor R13′. The collector of transistor Q5′ is connected to the positive supply terminal B+ and the collector of transistor Q6′ is similarly connected to the negative supply terminal R−. The base of transistor Q5′ is direct-current coupled to the lower end of collector load resistor R11′ and the base of transistor Q6′ is direct-coupled to the collector of transistor Q4′.

The push-pull output stage is of the complementary type and comprises an NPN output transistor Q7′ and a PNP output transistor Q8′ having their emitters connected to output bus O′. The base of output transistor Q7′ is direct-coupled to the emitter of drive transistor Q5′ and the base of output transistor Q8′ is similarly direct-coupled to the emitter of drive transistor Q6′.

Transistors Q9′ and Q10′ constitute the protective circuit to prevent output transistors Q7′ and Q8′ from undergoing second breakdown in the event of a short-circuit across output terminals O1′, O2′, or a load impedance which is either highly reactive or too low in magnitude. or any other condition which might cause the operating point of one of the output transistors to enter a region of high instantaneous current simultaneous with high instantaneous voltage. This might occur, for example, even with a normal speaker load if the amplifier is driven with a large low-frequency transient signal such as is generated when the tone arm is dropped upon the record or when switching between signal sources or when plugging and unplugging connector cables with the equipment energized. This protective circuit is substantially the same in principle and mode of operation to that first disclosed in said prior application Ser. No. 388,399 (and described with respect to FIG. 3 above) except for minor differences arising from the fact that in said prior application the current-sensing resistor was connected to the ground output terminal whereas in the present embodiment it is connected to the hot output terminal.

This current-sensing resistor is designated R17′ in FIG. 5 and is connected in series between output bus O′ and the hot output terminal O1′. The respective emitters of transistors Q9,′ Q10′ are connected to one end of resistor R17′ and their respective bases are connected through resistors R14', R15' to the opposite end of resistor R17'. Said bases are also connected through resistors R16', R18' to ground. The collector of transistor Q9' is connected through diode D3' to the collector of transistor Q2' and the base of transistor Q3', and the collector of transistor Q10' is similarly connected to said collector and base through diode D4'.

As originally described in said prior application Ser. No. 388,399 the protective circuit continuously senses both the instantaneous voltage and instantaneous current of the output transistors, and thereby monitors the instantaneous power dissipation of the output transistors. Should the operating point of either of the output transistors tend to enter a region of higher instantaneous power dissipation than that predetermined by the selected parameter values of the protective circuit, the latter will clip the drive signal from transistor Q2' to transistor Q3', in the following manner.

The load current passing through loadspeaker S from output stage Q7', Q8' must flow through resistor R17' so that the instantaneous voltage across the latter is directly proportional to the emitter current of the output transistor which is conducting at that instant. This current-responsive voltage is applied across the respective base-emitter junctions of transistors Q9', Q10' through resistors R14', R15' to forward-bias one junction and reverse-bias the other, depending upon the direction of current flow through resistor R17'. For example, if the direction is from output transistor Q7' to output terminal O1' then the base-emitter junction of transistor Q9' will tend to be forward-biased whereas that of transistor Q10' will tend to be reverse-biased.

Opposing this bias is a signal applied to the respective bases of transistors Q9', Q10' and which is proportional to the voltage swing of the midpoint of the output stage at the junction of the emitters of transistors Q7', Q8'. For example, assuming that output transistor Q7' is conductive, the potential of the output stage midpoint will go positive. Since resistor R17' is preferably in the range of about one-half ohm the potential of output terminal O1' will closely follow the rising potential at the midpoint of the output stage so as to raise the potential at the emitter of transistor Q9'. However the base of transistor Q9' does not rise in potential to the same extent because of the connection to ground through resistor R16' and hence the rise in potential at output terminal O1' will tend to maintain transistor Q9' cut off. Transistor Q9' will then have no effect upon the signal transmitted by transistor Q4' to drive stage Q5', Q6'.

However, let it now be assumed that output terminals O1', O2' are inadvertently short-circuited and that the signal is rising in potential so as to render output transistor Q7' conductive. Because of the short-circuit, output terminal O1' remains at ground potential. The emitter of output transistor Q7' can thus rise above ground potential only by the relatively small amount of the voltage drop across resistor R17', and hence the collector-to-emitter voltage of output transistor Q7' remains high. As the emitter current from transistor Q7' flows through the short-circuit at the output terminals O1', O2' the potential at the lefthand end of resistor R17' rises so as to forward-bias the base-emitter junction of transistor Q9'. Resistor R16' does not in this instance provide a reverse-bias signal since the emitter of transistor Q9' remains at ground potential due to the short-circuit across output terminals O1', O2'. Transistor Q9' thus becomes conductive to forward-bias diode D3' and draw current downwardly through collector load resistors R7', R8'. The positively swinging signal at the base of transistor Q3' is thereby instantaneously clipped so as to prevent further drive through drive transistor Q5' to output transistor Q7'. The operating point of the latter is thereby prevented from rising toward the region of high collector current and second breakdown.

It will be apparent that when output transistor Q8' is conductive transistor Q10' will function in a similar manner in response to a short-circuit across output terminals O1', O2' to clip the signal potential at the base of transistor Q3' and thereby prevent the operating point of output transistor Q8' from exceeding the second breakdown limit. It will be seen that the above-described mode of operation will also be effective when the load across output terminals O1, O2 is of low magnitude so as to present an excessively steep load-line or is highly reactive.

The preferred parameters of the protective circuit components are as follows: resistor R17': 0.56 ohm; resistors R14', R15': 100 ohms; resistors R16', R18': 1,000 ohms.

The power supply comprises a transformer T having a primary winding T1 connected through a slow-blow fuse F3 to the usual alternating-current house line of about 117 volts applied at line terminals L1, L2. The transformer secondary winding T2 is provided with a center-tap grounded as shown. A conventional full-wave rectifier bridge comprising rectifiers D5', D6', D7', D8' is connected to the transformer secondary winding T2 and also to the filter capacitors C7' and C8'. The junction of the latter is connected to ground at the negative terminal of capacitor C7' and the positive terminal of capacitor C8'. The positive terminal of capacitor C7' constitutes the $B^+$ terminal of the power supply and the negative terminal of capacitor C8' constitutes the $B^-$ terminal of the power supply. Fast-blow instrument fuses F1, F2 are in the $B^+$ and $B^-$ supply lines respectively.

Crossover distortion is obviated by the unity-gain feedback loop formed by the connection of output bus O' to the emitter of transistor Q3'. The portion of the amplifier following the collector of transistor Q2' operates effectively in the emitter-follower mode with consequent low distortion.

I claim:

1. A transistor power amplifier comprising
an amplification stage,
an output stage including an output transistor and an output terminal adapted to be connected to a load,
a non-voltage-amplifying signal transmission path extending from said amplification stage to said output stage,
a protective circuit including a protective transistor,
passive conductive means connecting said protective transistor to said amplification stage and tending to reduce the amplification of the latter in response to increased activation of said protective transistor,
resistive means in series with said output transistor, said output terminal and said load,
passive conductive means extending from said resistive means to said protective transistor to bias the operating point of the latter toward the direction of increasing activation in response to the magnitude of output current through said resistive means, and
passive conductive means extending from said output stage to said protective transistor to bias the operating point of the latter in the opposite direction of decreasing activation in response to the magnitude of voltage swing of said output stage.

2. A transistor power amplifier as recited in claim 1 wherein
said protective transistor has a collector,
said first-recited passive conductive means connecting said collector to said amplification stage.

3. A transistor power amplifier as recited in claim 1 wherein
said protective transistor has a base,
said second-recited passive conductive means connecting said resistive means to said base.

4. A transistor power amplifier as recited in claim 1 wherein
said protective transistor has a collector,
said first-recited passive conductive means connecting said collector to said amplification stage, said protective transistor has a base,
said second-recited passive conductive means connecting said resistive mean to said base.

5. A transistor power amplifier comprising
an amplification stage,
a single-ended push-pull output stage including a pair of output transistors and an output terminal adapted to be connected to a load,
a signal transmission path extending from said amplification stage to said output stage,
a protective circuit including a pair of complementary protective transistors,
passive conductive means connecting said protective transistors to said amplification stage and each tending to reduce the amplification of the latter in a respective direction of the voltage swing of the output terminal in response to increased activation of said protective transistor,
resistive means in series with said output transistors, said output terminal and said load,
passive conductive means extending from said resistive means to said protective transistors to bias the operating point of a respective one of the latter toward the direction of increasing activation in response to the magnitude of output current through said resistive means in a respective direction with regard to the load, and
passive conductive means extending to said protective transistors to bias the operating point of said respective one of the latter in the opposite direction of decreasing activation in response to the magnitude of voltage swing of said output terminal.

6. A transistor power amplifier as recited in claim 5 wherein
each of said protective transistors has a collector,
said amplification stage comprising a transistor having a collector,
said first-recited passive conductive means connecting said protective transistor collectors to said amplification transistor collector.

7. A transistor power amplifier as recited in claim 5 wherein
said protective transistors each have a base,
said second-recited passive conductive means connecting said resistive means to said bases.

8. A transistor power amplifier as recited in claim 5 wherein
each of said protective transistors has a collector,
said amplification stage comprising a transistor having a collector,
said first-recited passive conductive means connecting said protective transistor collectors to said amplification transistor collector,
said protective transistors each have a base,
said second-recited passive conductive means connecting said resistive means to said bases.

9. A transistor power amplifier as recited in claim 5 wherein
said amplification stage comprises a transistor having a collector,
said signal transmission path comprising a complementary-symmetry drive stage operating in the emitter-follower mode and drivingly connected to said output stage, and
means drivingly connecting said amplification transistor collector to said drive stage,
said first-recited passive conductive means connecting said protective transistors to said amplification transistor collector.

10. A transistor power amplifier as recited in claim 9 wherein
each of said protective transistors comprises a base,
said second-recited passive conductive means connecting said resistive means to said bases.

11. A transistor power amplifier as recited in claim 9 wherein
each of said protective transistors comprises a collector,
said first-recited passive conductive means connecting said protective transistor collectors to said amplification transistor collector.

12. A transistor power amplifier comprising
an amplification stage including a transistor having a collector output,
a complementary-symmetry push-pull drive stage,
a network drivingly connecting said drive stage to said collector output,
a single-ended push-pull output stage drivingly connected to said drive stage and adapted to be connected to a load,
first means connected in series with and responsive to the current through said output stage and said load,
second means connected to and responsive to the voltage swing of said output stage, and
third means connected to said first and second means and said collector output for reducing the signal at said collector output in response to a predetermined result of a comparison of the respective responses of said first and second means.

13. A transistor power amplifier as recited in claim 12 wherein
said third means comprises a protective transistor having a collector and a base-emitter junction,
means tending to forward-bias said junction in response to said first means,
means tending to reverse-bias said junction in response to said second means,
means normally biasing said protective transistor to a cut-off state, and
passive conductive means connecting said protective transistor collector to said amplification stage collector output for reducing the signal at the latter in response to activation of the protective transistor.

14. A transistor power amplifier as recited in claim 13 wherein
the signal transmission path consisting of said connecting network, drive stage and output stage has approximately unity voltage gain, and wherein
said protective transistor provides substantially the entire open-loop voltage gain of the closed loop consisting of said signal transmission path and said protective transistor.

15. A transistor power amplifier as recited in claim 12 wherein
said third means comprises a pair of complementary transistors each having a base-emitter junction,
means tending to forward-bias said junctions in response to said first means,
means tending to reverse-bias said junctions in response to said second means,
bias means normally biasing said complementary transistors to cut-off, and
means for reducing the signal at said collector in response to activation of one of said complementary transistors.

16. A transistor power amplifier as recited in claim 15 wherein
each of said complementary transistors comprises a collector, and
diode means connecting the collectors of said complementary transistors to the collector output of said amplification stage transistor,
said output stage comprising a pair of output transistors, and
an output terminal for connection to a load,
said first means including resistive means having one end conductively connected to said output transistors and another end conductively connected to said output terminal.

17. A transistor power amplifier as recited in claim 12 wherein said output stage comprises a pair of output transistors each having an output electrode conductively connected to a common junction, a hot output terminal connected to said junction and adapted to be connected to one end of a load, a grounded output terminal adapted to be connected to the other end of the load, said first means including resistive means connected in series with said load and between said output electrodes and said grounded output terminal.

18. A transistor power amplifier as recited in claim 17 wherein said resistive means is located between said output electrodes and said hot output terminal, said third means comprising a protective transistor having a base, an emitter and a collector, passive means connecting said base to one of said output electrodes, passive means connecting said emitter to said hot output terminal, and passive means connecting said protective transistor collector to said amplification stage collector output.

19. A transistor power amplifier as recited in claim 18 wherein said third means comprises a second protective transistor of a polarity complementary to said first-recited protective transistor and having a base, an emitter and a collector, passive means connecting said last recited base to the other of said output electrodes, passive means connecting said last-recited emitter to said hot output terminal, and passive means connecting said last-recited collector to said amplification stage collector output, whereby said first-recited protective transistor may be activated during a voltage swing of said amplification stage collector output in one direction and said last-recited protective transistor may be activated during the voltage swing of said amplification stage collector output in the opposite direction.

20. A transistor power amplifier as recited in claim 19 and comprising a node maintained substantially at the same potential as the quiescent potential of said junction connected to said output stage electrodes, said second voltage-swing-responsive means comprising circuit means connecting said protective transistor bases to said node.

21. A transistor power amplifier comprising a voltage amplification stage including a transistor having a collector output network, a complementary-symmetry push-pull stage comprising a pair of complementary transistors each having a base, circuit means connecting said bases to said collector output network, an output terminal for connection to a load, circuit means drivingly connected between said push-pull stage and said output terminal, current-sensing resistive means in series with said output terminal and said load, a pair of protective transistors of complementary polarity and each having a base-emitter junction, and a collector, first diode means connecting one of said protective transistor collectors to said collector output network, second diode means connecting the other of said protective transistor collectors to said collector output network, first means tending to forward-bias one of said protective transistor base-emitter junctions in response to the magnitude of the load current flowing through said resistive means in one direction with respect to the load, second means tending to forward-bias the other of said protective transistor base-emitter junctions in response to the magnitude of the load current flowing through said resistive means in the opposite direction with respect to the load, third means tending to reverse-bias said one protective transistor base-emitter junction in response to the magnitude of the voltage swing of said output terminal in one direction, and fourth means tending to reverse-bias said other protective transistor base-emitter junction in response to the magnitude of the voltage swing of said output terminal in the opposite direction.

22. A transistor power amplifier as recited in claim 21 wherein each of said protective transistors has a base and an emitter, said first and second forward-bias means including conductive means connecting each of said protective transistor bases to an end of said resistive means and each of said protective transistor emitters to a respective opposite end of said resistive means.

23. A transistor power amplifier as recited in claim 22 and comprising a power supply having relatively positive and negative supply terminals, a node maintained at a substantially fixed potential approximately midway between the potentials of said supply terminals, said third and fourth reverse-bias means including passive network means connecting said protective transistor bases to said node.

24. A transistor power amplifier as recited in claim 23 and comprising a push-pull output stage drivingly connected to said push-pull complementary symmetry stage so as to be driven thereby, said output stage including a pair of output transistors each having an output electrode, said current-sensing resistive means being conductively connected to and extending between said output electrodes and said output terminal.

References Cited

UNITED STATES PATENTS

| | | | |
|---|---|---|---|
| 3,102,241 | 8/1963 | Johnstone | 330—22 |
| 3,277,386 | 10/1966 | Miyazawa | 330—22 |

ROY LAKE, Primary Examiner

LAWRENCE J. DAHL, Assistant Examiner

U.S. Cl. X.R.

330—22